United States Patent [19]

Mallard et al.

[11] Patent Number: 4,607,223
[45] Date of Patent: Aug. 19, 1986

[54] NUCLEAR MAGNETIC RESONANCE IMAGING METHOD

[75] Inventors: John R. Mallard; Glyn Johnson; Linda M. Eastwood; Thomas W. Redpath, all of Aberdeen; James M. S. Hutchison, Westhill, all of Scotland

[73] Assignee: National Research Development Corporation, London, England

[21] Appl. No.: 520,231

[22] Filed: Aug. 4, 1983

[30] Foreign Application Priority Data

Aug. 13, 1982 [GB] United Kingdom ............... 8223331

[51] Int. Cl.[4] .......................................... G01N 24/08
[52] U.S. Cl. ............................................... 324/309
[58] Field of Search ............................ 324/307, 309

[56] References Cited

U.S. PATENT DOCUMENTS

| | | | |
|---|---|---|---|
| 4,318,043 | 3/1982 | Crooks et al. | 324/309 |
| 4,319,190 | 3/1982 | Brown | 324/309 |
| 4,431,968 | 2/1984 | Edelstein et al. | 324/309 |
| 4,484,138 | 11/1984 | Bottomley et al. | 324/309 |

FOREIGN PATENT DOCUMENTS

| | | | |
|---|---|---|---|
| 8102788 | 10/1981 | PCT Int'l. Appl | 324/307 |
| 8102789 | 10/1981 | PCT Int'l. Appl | 324/307 |
| 2079463 | 1/1982 | United Kingdom . | |

Primary Examiner—Reinhard J. Eisenzopf
Assistant Examiner—Kevin D. O'Shea
Attorney, Agent, or Firm—Silverman, Cass, Singer & Winburn

[57] ABSTRACT

A method of deriving three dimensional image information from an object using nuclear magnetic resonance signals is described. The method comprises subjecting the object to a continuous, static magnetic field and carrying out the following set of sequential steps.

1. Exciting nuclear spins in a volume;
2. applying non-aligned first, second and third gradients of the magnetic field;
3. causing the spins to rephase periodically in the presence of the first gradient;
4. phase encoding the spins in the direction of the second gradient prior to every read-out of the rephased FIS from the object;

and then successively repeating the above set of steps with different values of gradient of the third gradient ($G_z^{(2)}$), there being a recovery interval between the repetition of successive sets of steps.

10 Claims, 2 Drawing Figures

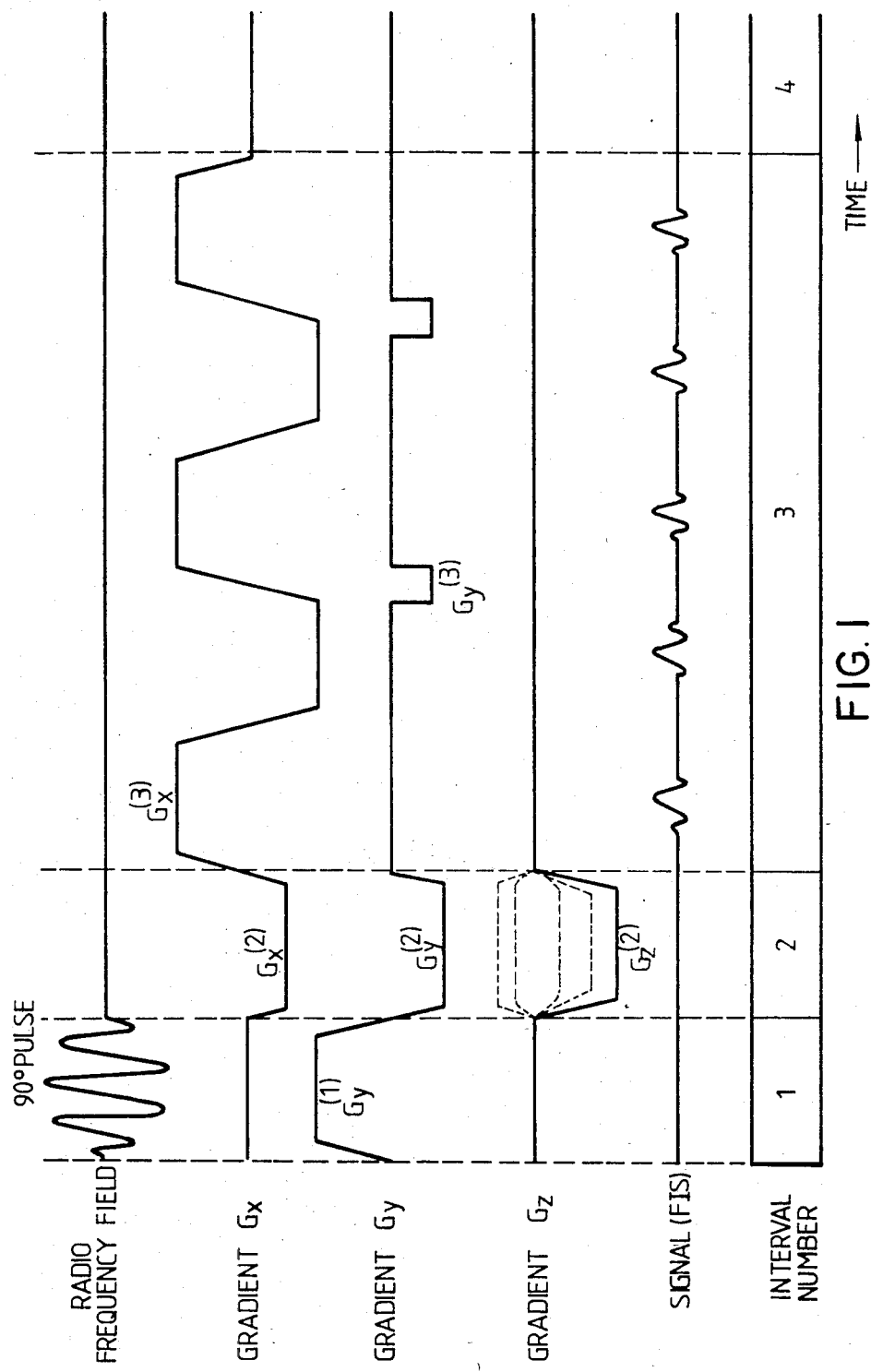

FIG. 2

$$\int G_z^{(2)} dt = n_z D_z \qquad n_z = 1, N_z \qquad (1)$$

$$\gamma L_z D_z \leq 2\pi \qquad (2)$$

$$D_y = \int_{pulse} G_y^{(3)} dt \leq 2\pi/\gamma L_y \qquad (3)$$

$$G_x^{(3)} T_x \leq 2\pi/\gamma L_x \qquad (4)$$

$$P(k_x, k_y, k_z) = \sum_{n_x=1}^{N_x} \exp\left\{-in_x \gamma G_x T_x L_x \left[\frac{2k_x - N_x}{2N_x}\right]\right\}$$

$$\times \sum_{n_y=1}^{N_y} \exp\left\{-in_y \gamma D_y L_y \left[\frac{2k_y - N_y}{2N_y}\right]\right\}$$

$$\times \sum_{n_z=1}^{N_z} \exp\left\{-in_z \gamma D_z L_z \left[\frac{2k_z - N_z}{2N_z}\right]\right\}$$

$$\times S(n_x, n_y, n_z)$$

$$k_x = 1, N_x; \; k_y = 1, N_y; \; k_z = 1, N_z \qquad (5)$$

NUCLEAR MAGNETIC RESONANCE IMAGING METHOD

The invention relates to a method of deriving image information from an object using nuclear magnetic resonance signals.

Nuclear magnetic resonance relies on the fact that when certain nuclei are exposed to a uniform static magnetic field they will precess around the axis of the applied magnetic field with a frequency proportional to the strength of the field. This frequency is known as the Larmor frequency and is given by the formula $\omega_o = \gamma H_o$, where $\gamma$ is the gyromagnetic ratio of the particular nucleus and $H_o$ is the strength of the magnetic field. By applying a static field which varies in strength along a particular direction, nuclei at each position in that direction precess at different frequencies. Thus, by applying a radio frequency magnetic field of sufficient strength at the same time as applying a gradient magnetic field across the object, only those nuclei with spins precessing with the frequency or frequencies of the pulse can be made to rotate through 90° or 180° and thus isolated from the remainder of the nuclei.

It has recently been proposed in British Patent Specification No. 2,079,946 to obtain a two dimensional image of an object by means of a method known as "spin warp". Broadly, spin warp involves defining a thin slab of spins in an object and then subjecting the object to a first gradient magnetic field ($G_x$) parallel with the slab and a second gradient magnetic field ($G_z$) parallel with the slab and orthogonal to the first gradient magnetic field, and subsequently reversing the first gradient magnetic field and detecting the free induction signal (FIS). This FIS is caused by the spins which were initially dephased by the first magnetic gradient subsequently rephasing to form a spin echo. The Fourier transform of the spin echo when sampled $N_x$ times gives a projection of the spin density onto a line parallel to the first magnetic gradient ($G_x$). The second magnetic gradient causes the phase of each spin in the direction of the second magnetic gradient to change and if this sequence of operations is repeated for $N_z$ values of the second magnetic gradient and the resulting outputs are Fourier transformed as described in Specification No. 2,079,946 and $N_x \times N_z$ array of the density values is produced.

As will be appreciated, this method enables a two-dimensional image of a plane in the object to be formed. In order to obtain a three-dimensional image, the method would need to be repeated for a plurality of slabs in the object. The disadvantages of this is that the time required for producing just a two-dimensional image of one plane is typically of the order of $N_z$ secs. This is because the time for one measurement is of the order of 1 second and in order to obtain an $N_x \times N_z$ array, $N_z$ signals need to be detected. Clearly, in the case of imaging the human body it is desirable for the total imaging time to be as short as possible.

In accordance with the present invention, a method of deriving three dimensional image information from an object using nuclear magnetic resonance signals comprises subjecting the object to a continuous, static magnetic field and carrying out a set of sequential steps which comprise:
1. exciting nuclear spins in a volume;
2. applying non-aligned first, second and third gradients of the magnetic field;
3. causing the spins to rephase periodically in the presence of the first gradient;
4. phase encoding the spins in the direction of the second gradient prior to every read-out of the rephased FIS from the object;

and then successively repeating the above set of steps with different values of gradient of the third gradient, there being a recovery interval between the repetition of successive sets of steps.

With this new method, the spin warp method is modified by the steps of causing the spins to rephase periodically under the influence of the first gradient of the magnetic field, these spins being phase encoded in the direction of the second gradient prior to every read-out. This provides information on spin density in the directions of the first and second gradients while the repetition of the steps with different values for the third gradient (spin warp) provides information on spin density in the third direction. It will appreciated that this considerably reduces the time required to provide a three-dimensional image. As an example, by sampling eight echoes per excitation, eight $N_x \times N_z$ images may be produced in the time taken to obtain one $N_x \times N_z$ image using the method described in British specification No. 2 079 946.

Preferably, the first, second, and third gradients are mutually orthogonal. Conveniently, the first, second and third gradients of the magnetic field are applied simultaneously in step number 2. Alternatively, however, these gradients may be applied in any order within the step number 2 since no radio frequency is applied at the same time.

Preferably, step number 4 is carried out by successive applications of the second gradient. Conveniently, the time integral of each application of the second gradient in step number 4 is the same. Successive applications of the second gradient are cumulative so that the spins are differently phase encoded at each readout.

Preferably, step number 1 comprises exciting nuclear spins in the presence of a selection gradient of the magnetic field which has a gradient direction perpendicular to a selected slab. In this case, step number 1 may further comprise reversing the direction of the selection gradient to rephase at least partially the spins. Step number 1 may be achieved by applying a 90° pulse in the presence of the selection gradient. Preferably, the frequency band of the 90° pulse defines the thickness of the slab.

The term "slab" has been used for convenience and is not intended to restrict the volume of selected spins to one whose thickness is significantly different from its length and breadth. In principle, any volume shape could be used.

If it desired to obtain information on the spin-lattice relaxation time ($T_1$) the steps of this method may be preceded by an initial step of inverting the spins followed by an interval approximately equal to the average relaxation time of the spins.

An example of a method in accordance with the present invention will now be described with reference to the accompanying drawings in which:

FIG. 1 is a pulse sequence diagram; and

FIG. 2 is a series of formula relating to the manner in which the free induction signal is processed according to the invention, and the numerals in parentheses correspond to the similar designations in the specification.

The apparatus for carrying out the method of the invention may be a conventional nuclear magnetic resonance imaging device and conveniently this provides a static magnetic field $H_o$ which lies along the Z axis and can supply a radio frequency (rf) signal along the Y axis. Coils are provided to produce magnetic gradients $G_x$, $G_y$, and $G_z$ to the magnetic field $H_o$ in the X, Y, and Z directions respectively. Such a machine is described for example in Journal of Physics E: Scientific Instruments, 13,947–955.

In practice, the static magnetic field is energised and then the following pulse sequence is carried out. The pulse sequence, as shown in FIG. 1, is divided into four successive time intervals which are repeated cyclically.

INTERVAL 1

A 90° rf pulse is applied at the same time as a magnetic field gradient $G_y^{(1)}$. FIG. 1 illustrates gradients $G_x^{(1)}$ and $G_z^{(1)}$ as being zero. This selectively excites nuclear spins in a slab with a thickness in the Y direction dependent on the frequencies present in the rf pulse. The thickness of the slab can be varied by varying the frequency bandwidth of the pulse or the amplitude of $G_y^{(1)}$.

INTERVAL 2

In this interval, a gradient $G_y^{(2)}$ is applied which has a reverse sense to $G_y^{(1)}$ in order partially to rephase the spins along the Y direction in order to maximise the FIS. The size of the $G_y^{(2)}$ gradient is smaller than that necessary to completely rephase the spins. Simultaneously, a gradient $G_x^{(2)}$ is applied to dephase the spins along the X direction; and a gradient $G_z^{(2)}$ is applied to phase encode the spins in the Z direction.

INTERVAL 3

In this interval, the gradient $G_x^{(3)}$ is periodically reversed and has, as nearly as possible, a square wave form. Each reversal of the gradient $G_x^{(3)}$ causes spins to rephase in the X direction and form spin echoes which are indicated in FIG. 1.

Gradient $G_z^{(3)}$ is maintained at zero amplitude.

In order to obtain discrimination in the Y direction gradient $G_y^{(3)}$ is periodically applied for a short time relatively to the period of $G_x^{(3)}$. Since successive echoes caused by reversal of $G_x^{(3)}$ are time reversed with respect to each other it is convenient to ignore every alternate FIS and so $G_y^{(3)}$ is applied in conjunction with alternate reversals of $G_x^{(3)}$. These applications of $G_y^{(3)}$ phase encode the spins in the Y direction. The affect of successive applications of $G_y^{(3)}$ is cumulative so that the spin echo after the second pulse carries differently coded Y-direction information than does the spin echo after the first pulse, and so on. As may be seen in the drawing, the amplitude and duration of each $G_y^{(3)}$ pulse is the same.

It is possible for a $G_y^{(3)}$ pulse to be applied after each reversal of the $G_x^{(3)}$ gradient but if this is done account must be taken of the time reversal of alternate echoes in subsequent processing.

INTERVAL 4

This represents the system recovery time and should be long compared with the spin-lattice relaxation time. The sequence is then repeated with different values of $G_z^{(2)}$ as previously described in British Specification No. 2,079,946.

The FIS is processed in the following way. (see FIG. 2) $N_x$ samples are taken from each of $N_y$ echos produced by reversal of gradient $G_x^{(3)}$. This $N_y$ echo series is repeated for $N_z$ different values of $G_z^{(2)}$ amplitude to give an $N_x \times N_y \times N_z$ array of data points. The time integral of $G_z^{(2)}$ conforms to a normal spin warp condition such as:

$$\int G_z^{(2)} dt = n_z D_z \quad n_z = 1, N_Z \qquad (1)$$

where $D_z$ is a constant gradient integral. To avoid aliasing (that is the possibility of extra phase shifts causing signals from some parts of the sample to appear incorrectly in the wrong part of the image) $D_z$ should fulfil the following condition:

$$\gamma L_z D_z \leq 2\pi \qquad (2)$$

where $L_z$ is the length of the volume to be imaged in the Z direction. Similarly, to avoid aliasing in the Y direction the time integral of $G_y^{(3)}$ over a single pulse should conform to the condition:

$$D_y = \int_{pulse} G_y^{(3)} dt \leq 2\pi/\gamma L_y \qquad (3)$$

where $L_y$ is the length of the excited slab in the Y direction.

The X direction aliasing condition is given by:

$$G_x^{(3)} T_x \leq 2\pi/\gamma L_x \qquad (4)$$

where $T_x$ is the time interval between consecutive samples from an echo and $L_x$ is the length of the volume to be imaged in the X direction. This is equivalent to the Nyguist criterion that signal bandwidth should not exceed twice the sampling frequency. Thus $L_x$ can be fixed by the use of suitable filters.

The image is obtained by a three-dimensional Fourier transform of the array of data values. If a single signal sample is $S(n_x, n_y, n_z)$, a single image point is given by a transform such as:

$$P(k_x, k_y, k_z) = \sum_{n_x=1}^{N_x} \exp\left\{-in_x\gamma G_x T_x L_x \left[\frac{2k_x - N_x}{2N_x}\right]\right\}$$

$$\times \sum_{n_y=1}^{N_y} \exp\left\{-in_y\gamma D_y L_y \left[\frac{2k_y - N_y}{2N_y}\right]\right\}$$

$$\times \sum_{n_z=1}^{N_z} \exp\left\{-in_z\gamma D_z L_z \left[\frac{2k_z - N_z}{2N_z}\right]\right\}$$

$$\times S(n_x, n_y, n_z)$$

$$k_x = 1, N_x; \ k_y = 1, N_y; \ k_z = 1, N_Z \qquad (5)$$

The read-out signals may be processed as described above in a computer which stores the results and may optionally provide a visual display in a conventional manner.

We claim:

1. A method of deriving three dimensional image information from a selected volume defined by an object using nuclear magnetic resonance signals, the method comprising subjecting the object to a continuous, static magnetic field and carrying out a set of sequential steps which comprise:

(a) exciting nuclear spins in said selected volume by applying an rf pulse in the presence of a selection gradient;

(b) applying non-aligned first, second, and third gradients of said magnetic field, said second gradient being aligned with said selection gradient;

(c) with said third gradient zero, periodically reversing said first gradient to cause said spins to rephase periodically, whereby a free induction signal (FIS) is generated, as said spins rephase; and phase encoding said spins in the direction of said second gradient prior to every read-out of the FIS from said object;

and then successively repeating said above set of steps with different values of gradient of said third gradient in step b, there being a recovery interval between the repetition of successive sets of said steps.

2. A method according to claim 1, wherein said first, second, and third gradients are mutually orthogonal.

3. A method according to claim 1, wherein said first, second, and third gradients of said magnetic field are applied simultaneously in said step b.

4. A method according to claim 1, wherein said step c comprises phase encoding said spins in the direction of said second gradient only prior to every alternate rephasing of said spins in response to reversal of said first gradient.

5. A method according to claim 1, wherein step c comprises phase encoding said spins in the direction of said second gradient prior to every rephasing of said spins in response to reversal of said first gradient while monitoring the time reversal of successive FIS.

6. A method according to claim 1, wherein the time integral of each application of said second gradient in step c is substantially the same.

7. A method according to claim 1, wherein said step a is achieved by applying a 90° pulse in the presence of said selection gradient.

8. A method according to claim 1, wherein the time integral of each application of said first gradient in step c is substantially the same.

9. A method according to claim 1, wherein the application of said second gradient in step b is such as to rephase said spins.

10. A method according to claim 1, wherein said first gradient is held constant while said FIS is read out.

* * * * *